US010051785B2

(12) United States Patent
Albinger et al.

(10) Patent No.: US 10,051,785 B2
(45) Date of Patent: Aug. 21, 2018

(54) IGNITION SYSTEM SWITCH MONITORING ASSEMBLY

(71) Applicant: HUSQVARNA AB, Huskvarna (SE)

(72) Inventors: Matt Albinger, Shelby, NC (US); Paul Beuger, Charlotte, NC (US)

(73) Assignee: HUSQVARNA AB, Husqvarna (SE)

( * ) Notice: Subject to any disclaimer, the term of this patent is extended or adjusted under 35 U.S.C. 154(b) by 0 days.

(21) Appl. No.: 15/103,160

(22) PCT Filed: Dec. 12, 2014

(86) PCT No.: PCT/IB2014/066857
§ 371 (c)(1),
(2) Date: Jun. 9, 2016

(87) PCT Pub. No.: WO2015/087297
PCT Pub. Date: Jun. 18, 2015

(65) Prior Publication Data
US 2016/0366817 A1 Dec. 22, 2016

Related U.S. Application Data

(60) Provisional application No. 61/915,200, filed on Dec. 12, 2013.

(51) Int. Cl.
*G06F 7/70* (2006.01)
*A01D 34/00* (2006.01)
(Continued)

(52) U.S. Cl.
CPC .......... *A01D 34/006* (2013.01); *A01D 34/64* (2013.01); *A01D 34/6818* (2013.01);
(Continued)

(58) Field of Classification Search
USPC .......................................... 701/50
See application file for complete search history.

(56) References Cited

U.S. PATENT DOCUMENTS 3,736,729 A * 6/1973 Peterson ............... A01D 34/64
56/10.5
6,609,357 B1 * 8/2003 Davis .................. A01D 34/006
56/10.2 A
(Continued)

FOREIGN PATENT DOCUMENTS

| GB | 2309552 A | * 7/1997 | .......... A01D 34/006 |
| GB | 2309552 A | 7/1997 | |
| WO | 2010051409 A2 | 5/2010 | |

OTHER PUBLICATIONS

International Search Report and Written Opinion of International Application No. PCT/IB2014/066857 dated May 8, 2015, all enclosed pages cited.

(Continued)

*Primary Examiner* — Tyler D Paige
(74) *Attorney, Agent, or Firm* — McNair Law Firm, P.A.

(57) ABSTRACT

A lawn care device may include an engine to selectively power the lawn care device, a frame supporting the engine of the lawn care device, and an ignition interface having a processor therein to enable selective powering of the lawn care device based at least in part on operation of the ignition interface. The ignition interface may include a switch monitoring assembly configured to enable the processor to monitor status of a plurality of switches associated with respective components of the lawn care device. The switch monitoring assembly may be further configured to enable the processor to monitor opposing statuses (330, 332 or 324, 326) of at least one of the switches.

17 Claims, 6 Drawing Sheets

(51) Int. Cl.
    *A01D 34/68*     (2006.01)
    *H03K 17/18*     (2006.01)
    *A01D 34/64*     (2006.01)
    *A01D 34/82*     (2006.01)
    *A01D 101/00*     (2006.01)

(52) U.S. Cl.
    CPC ............ *A01D 34/82* (2013.01); *H03K 17/18* (2013.01); *A01D 2101/00* (2013.01); *B60Y 2200/223* (2013.01)

(56) References Cited

U.S. PATENT DOCUMENTS

| | | | | |
|---|---|---|---|---|
| 2006/0021312 A1* | 2/2006 | Brandon | ............... | A01D 34/006 56/10.2 R |
| 2012/0227368 A1* | 9/2012 | Koike | ................... | A01D 69/02 56/10.2 A |
| 2014/0266664 A1* | 9/2014 | Dwyer | ................... | B60K 35/00 340/459 |
| 2015/0007541 A1* | 1/2015 | Albinger | ................ | A01D 69/02 56/10.2 A |
| 2015/0066309 A1* | 3/2015 | Porter | ................... | B60W 10/06 701/48 |
| 2015/0296706 A1* | 10/2015 | Albinger | .............. | A01D 34/828 56/10.5 |
| 2016/0007525 A1* | 1/2016 | Drew | ................... | A01D 34/006 56/10.2 R |

OTHER PUBLICATIONS

International Preliminary Report on Patentability for International Application No. PCT/IB2014/066857 dated Jun. 14, 2016, all enclosed pages cited.

* cited by examiner

IGNITION SYSTEM SWITCH MONITORING ASSEMBLY

TECHNICAL FIELD

Example embodiments generally relate to outdoor power equipment and, more particularly, some embodiments relate to a switch monitoring assembly for an ignition system of a lawn care vehicle.

BACKGROUND

Lawn care tasks are commonly performed using various tools and/or machines that are configured for the performance of corresponding specific tasks. Certain tasks, like grass cutting, are typically performed by lawn mowers. Lawn mowers themselves may have many different configurations to support the needs and budgets of consumers. Walk-behind lawn mowers are typically compact, have comparatively small engines and are relatively inexpensive. Meanwhile, at the other end of the spectrum, riding lawn mowers, such as lawn tractors, can be quite large. Riding lawn mowers can sometimes also be configured with various functional accessories (e.g., trailers, tillers and/or the like) in addition to grass cutting components. Riding lawn mowers provide the convenience of a riding vehicle as well as a typically larger cutting deck as compared to a walk-behind model.

Ignition systems for many handheld or walk behind outdoor power equipment devices are based on a recoil start (or pull start). In such a device, a rope with a grip at the end is coiled around a mechanism that is coupled to an end of the crankshaft. When the rope is pulled to cause uncoiling, the crankshaft spins to crank the engine. Larger pieces of equipment such as riding lawn mowers more commonly employ electric starters. Electric starters are generally used by larger pieces of equipment since the electric starting motor (or starter motor) of such devices typically requires battery power that is more practically supportable by a larger device. A common electric starter may include a starter solenoid. A key operated switch is typically used to apply battery power to the solenoid. Application of power to the solenoid through the key operated switch closes high current contacts for the starter motor to cause it to turn for a limited period of time to start the engine.

Although the use of a key operated switch is relatively familiar to many users, it represents a relatively limited user interface. Thus, it may be desirable to provide an improved, or more modern, user interface for vehicle starting. The provision of such an improved interface may also enable the provision of additional functionality that had not previously been possible to deliver.

BRIEF SUMMARY OF SOME EXAMPLES

Some example embodiments may provide an electronic ignition system for employment, for example, with riding lawn care equipment or other outdoor power equipment. The electronic ignition starting system may be considered to be a "smart ignition" system by virtue of the additional functionality it may provide relative to a conventional key operated switch in a starter system. Some example embodiments may improve the ability of operators to operate outdoor power equipment such as, for example, riding lawn mowers. In this regard, some embodiments may provide an improved ignition system that is further capable of monitoring both states of the safety switches with which the ignition system interfaces. Operators may therefore take fuller advantage of the capabilities of their outdoor power equipment devices, while such devices operate more safely and effectively, and thus the operators may have a greater satisfaction with the performance of their outdoor power equipment devices.

In an example embodiment, a lawn care device is provided. The lawn care device may include an engine to selectively power the lawn care device, a frame supporting the engine of the lawn care device, and an ignition interface having a processor therein to enable selective powering of the lawn care device based at least in part on operation of the ignition interface. The ignition interface may include a switch monitoring assembly configured to enable the processor to monitor status of a plurality of switches associated with respective components of the lawn care device. The switch monitoring assembly may be further configured to enable the processor to monitor opposing statuses of at least one of the switches.

In another example embodiment, ignition system for a lawn care device is provided. The ignition system may include a processor and a device interface configured to interface between the processor and a data bus operably coupled to a plurality of switches associated with respective components of the lawn care device. The processor may be configured to monitor status of a plurality of switches associated with respective components of the lawn care device. The processor may further be configured to monitor opposing statuses of at least one of the switches.

In still another example embodiment, a method of monitoring switch status in an ignition system for a lawn care device is provided. The method may include monitoring status of a plurality of switches associated with respective components of the lawn care device, and monitoring opposing statuses of at least one of the switches.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION

Figure 1:
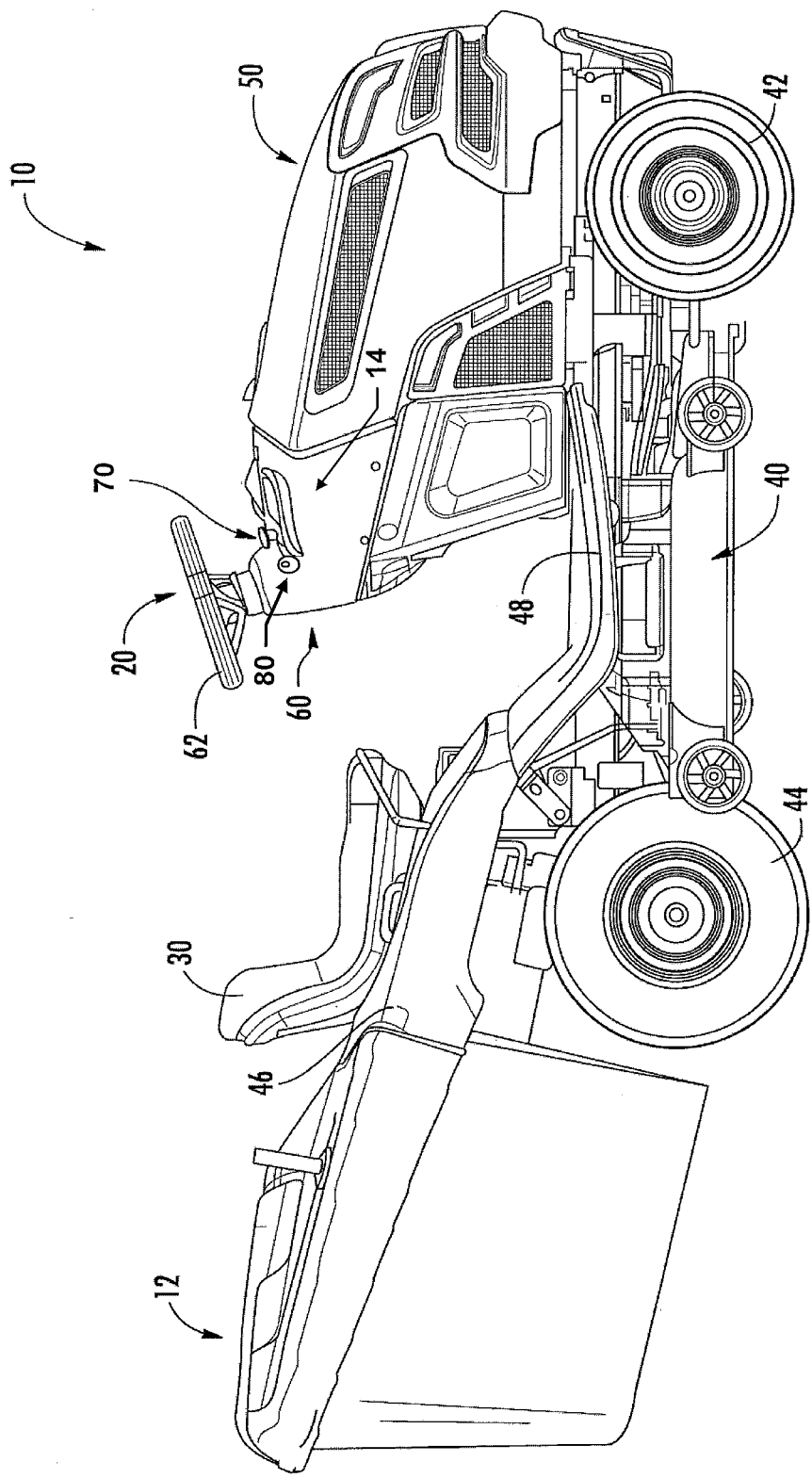
FIG. 1 illustrates a perspective view of the riding lawn care vehicle according to an example embodiment.

Some example embodiments now will be described more fully hereinafter with reference to the accompanying drawings, in which some, but not all example embodiments are shown. Indeed, the examples described and pictured herein should not be construed as being limiting as to the scope, applicability, or configuration of the present disclosure. Rather, these example embodiments are provided so that this disclosure will satisfy applicable legal requirements. Like reference numerals refer to like elements throughout. Furthermore, as used herein, the term "or" is to be interpreted as a logical operator that results in true whenever one or more of its operands are true. Additionally, the term "lawn care" is meant to relate to any yard maintenance activity and need not specifically apply to activities directly tied to grass, turf or sod care. As used herein, operable coupling should be understood to relate to direct or indirect connection that, in either case, enables functional interconnection of components that are operably coupled to each other.

When a microprocessor is introduced into an ignition interface, the potential for employing additional functionality into the control and monitoring capabilities associated with the ignition interface may be increased. For example, by providing a number of sensor and/or safety switch inputs to the microprocessor, the corresponding inputs may be monitored to try to determine certain situations for which intervention or other functional activity may be desired. However, for a typical monitoring system configured to monitor the states of various components having two states (e.g., on/off, engaged/disengaged, powered/unpowered, normal/fault, etc.), the system is set up to detect one state and, when the state monitored is not detected, the system will typically infer that the other state must be present. This method of monitoring is relatively simple and, in many cases, is sufficient to provide the desired result.

Although monitoring a single state and inferring the other state can be sufficient in many cases, some fault conditions, whether they occur due to a component failure or due to tampering, may be missed if only one state is monitored. For example, for a circuit monitoring the position of a particular switch by detecting when the switch is closed and inferring that if a closed condition is not detected that the switch must be open, it is possible that a fault may occur in the switch closure detection circuit. Then, even when the switch is closed, the closed condition may not be detected so that it will be inferred that the switch is open. A corresponding action may then be taken in error and, if the closure of the switch is required for protection of the operator or other components, injury or damage could occur when the corresponding action is taken. However, if the open state was also detected, the operator may get conflicting reports indicating that the switch is open while there is no indication that the switch is closed. This conflict may cause the operator to investigate and discover the fault before taking the corresponding action in error and endangering the operator or equipment. Thus, particularly for some safety related conditions, it may be preferable to monitor both states of certain switches.

An example embodiment is provided to monitor both states of at least some switches associated with an ignition system. In particular, some embodiments may monitor both states of certain safety-related switches (e.g., seat presence and PTO switches) using a monitoring circuit configured accordingly. Some embodiments also provide a switch monitoring assembly that provides for a plurality of different switches and/or sensors to be monitored selectively by a microprocessor in sequence on a periodic basis. The switch monitoring assembly employs a plurality of sensing circuits that are selectively polled by the microprocessor using a common pull-up voltage monitoring component that sets the monitoring voltage for each of the plurality of sensing circuits. The common pull-up voltage monitoring component is also monitored itself so that the health of the switch monitoring assembly can be confirmed.

FIG. 1 illustrates an example lawn care device in the form of a riding lawn care vehicle 10 having a bagging attachment 12. However, it should be appreciated that example embodiments may be employed on numerous other riding lawn care vehicles that may not include a bagging attachment 12. The riding lawn care vehicle 10 may also include an operations panel 14 that may display operational information regarding the riding lawn care vehicle 10 and host various controls, gauges, switches, displays, and/or the like. As shown and described herein, the riding lawn care vehicle 10 may be a riding lawn mower (e.g., a lawn tractor, front-mount riding lawn mower, riding lawn mower with a zero or near zero degree radius of turn, cross mower, stand-on riding lawn mower, and/or the like). However, other example embodiments may be employed on other outdoor power equipment devices, such as walk behind lawn mowers, tillers, snow throwers, and/or the like.

The riding lawn care vehicle 10 may include a steering assembly 20 (e.g., including a steering wheel, handle bars, or other steering apparatus) functionally connected to wheels of the riding lawn care vehicle 10 to which steering inputs are provided (e.g., the front and/or rear wheels in various different embodiments) to allow the operator to steer the riding lawn care vehicle 10. In some embodiments, the riding lawn care vehicle 10 may include a seat 30 that may be disposed at a center, rear, or front portion of the riding lawn care vehicle 10. The operator may sit on the seat 30, which may be disposed to the rear of the steering assembly 20 to provide input for steering of the riding lawn care vehicle 10 via the steering assembly 20.

The riding lawn care vehicle 10 may also include, or be configured to support attachment of, a cutting deck 40 having at least one cutting blade mounted therein. In some cases, a height of the at least one cutting blade may be adjustable by an operator of the riding lawn care vehicle 10. The cutting deck 40 may be a fixed or removable attachment in various different embodiments. Moreover, a location of the cutting deck 40 may vary in various alternative embodiments. For example, in some cases, the cutting deck 40 may be positioned in front of the front wheels 42, behind the rear wheels 44, or in between the front and rear wheels 42 and 44 (as shown in FIG. 1) to enable the operator to cut grass using the at least one cutting blade when the at least one cutting blade is rotated below the cutting deck 40. In some embodiments, the cutting deck 40 may be lifted or rotated relative to the lawn mower frame to permit easier access to the underside of the lawn mower without requiring removal of the cutting deck 40. The cutting deck 40 may have one, two, three, or more cutting blades driven by one, two, three, or more rotatable shafts. The shafts may be rotated by any number of mechanisms. For example, in some embodiments, the shafts are coupled to a motor via a system of belts and pulleys. In other embodiments, the shafts may be coupled to the motor via a system of universal joints, gears, and/or other shafts. In still other embodiments, such as in an electric lawn mower, the shaft may extend directly from an electric motor positioned over the cutting deck.

In some embodiments, the front wheels 42 and/or the rear wheels 44 may have a shielding device positioned proximate thereto in order to prevent material picked up in the wheels from being ejected toward the operator. Fender 46 is an example of such a shielding device. When operating to cut grass, the grass clippings may be captured by a collection system (e.g., bagging attachment 12), mulched, or expelled from the cutting deck 40 via either a side discharge or a rear discharge.

The riding lawn care vehicle 10 may also include additional control-related components such as one or more speed controllers, brakes, cutting height adjusters, and/or the like. Some of the controllers, such as the speed controllers and/or brakes, may be provided in the form of foot pedals that may sit proximate to a footrest 48 (which may include a portion on both sides of the riding lawn care vehicle 10) to enable the operator to rest his or her feet thereon while seated in the seat 20.

In the pictured example embodiment of FIG. 1, an engine 50 of the riding lawn care vehicle 10 is disposed substantially forward of a seated operator. However, in other example embodiments, the engine 50 could be in different positions such as below or behind the operator. In some embodiments, the engine 50 may be operably coupled to one or more of the wheels of the riding lawn care vehicle 10 in order to provide drive power for the riding lawn care vehicle 10. In some embodiments, the engine 50 may be capable of powering two wheels, while in others, the engine 50 may power all four wheels of the riding lawn care vehicle 10. Moreover, in some cases, the engine 50 may manually or automatically shift between powering either two wheels or all four wheels of the riding lawn care vehicle 10. The engine 50 may be housed within a cover that forms an engine compartment to protect engine 50 components and improve the aesthetic appeal of the riding lawn care vehicle 10.

In an example embodiment, the engine compartment may be positioned proximate to and/or mate with portions of a steering assembly housing 60. The steering assembly housing 60 may house components of the steering assembly 20 to protect such components and improve the aesthetic appeal of the riding lawn care vehicle 10. In some embodiments, a steering wheel 62 of the steering assembly 20 may extend from the steering assembly housing 60 and a steering column (not shown) may extend from the steering wheel 62 down through the steering assembly housing 60 to components that translate inputs at the steering wheel 62 to the wheels to which steering inputs are provided.

In some embodiments, the engine 50 may also provide power to turn the cutting blade or blades disposed within the cutting deck 40. In this regard, for example, the engine 50 may be used to turn a shaft upon which the cutting blade or blades may be fixed (e.g., via a belt and pulley system and/or other mechanisms). The turning of the shaft, at high speeds, may move the cutting blade or blades through a range of motion that creates air movement that tends to straighten grass for cutting by the moving blade and then eject the cut grass out of the cutting deck 40 (e.g., to the bagging attachment 12 or to the back or side of the riding lawn care vehicle 10), unless the blade and mower are configured for mulching.

In an example embodiment, the engine 50 may turn at least one shaft that is coupled to corresponding ones of one or more cutting blades within the cutting deck 40 via a PTO clutch. When the PTO clutch is engaged, rotary power generated by the engine 50 may be coupled to the one or more cutting blades to cause rotation thereof (e.g., for cutting grass). When the PTO clutch is disengaged, rotary power generated by the engine 50 may not be coupled to the one or more cutting blades and thus the cutting blades may not rotate. In some embodiments, engagement of the PTO clutch may be accomplished via operation of a PTO switch 70 that may be disposed on or proximate to the operations panel 14.

The operations panel 14, or some other portion of the steering assembly housing 60, may also provide support for an ignition interface 80 of an example embodiment. The ignition interface 80 may be used for starting the engine 50 and for controlling other functions of the riding lawn care vehicle 10. In an example embodiment, the ignition interface 80 may not require a key to operate. Thus, the operator of the riding lawn care vehicle 10 may be enabled to start and/or initiate one or more functional capabilities of the riding lawn care vehicle 10 without the use of a physical key.

Figure 2:
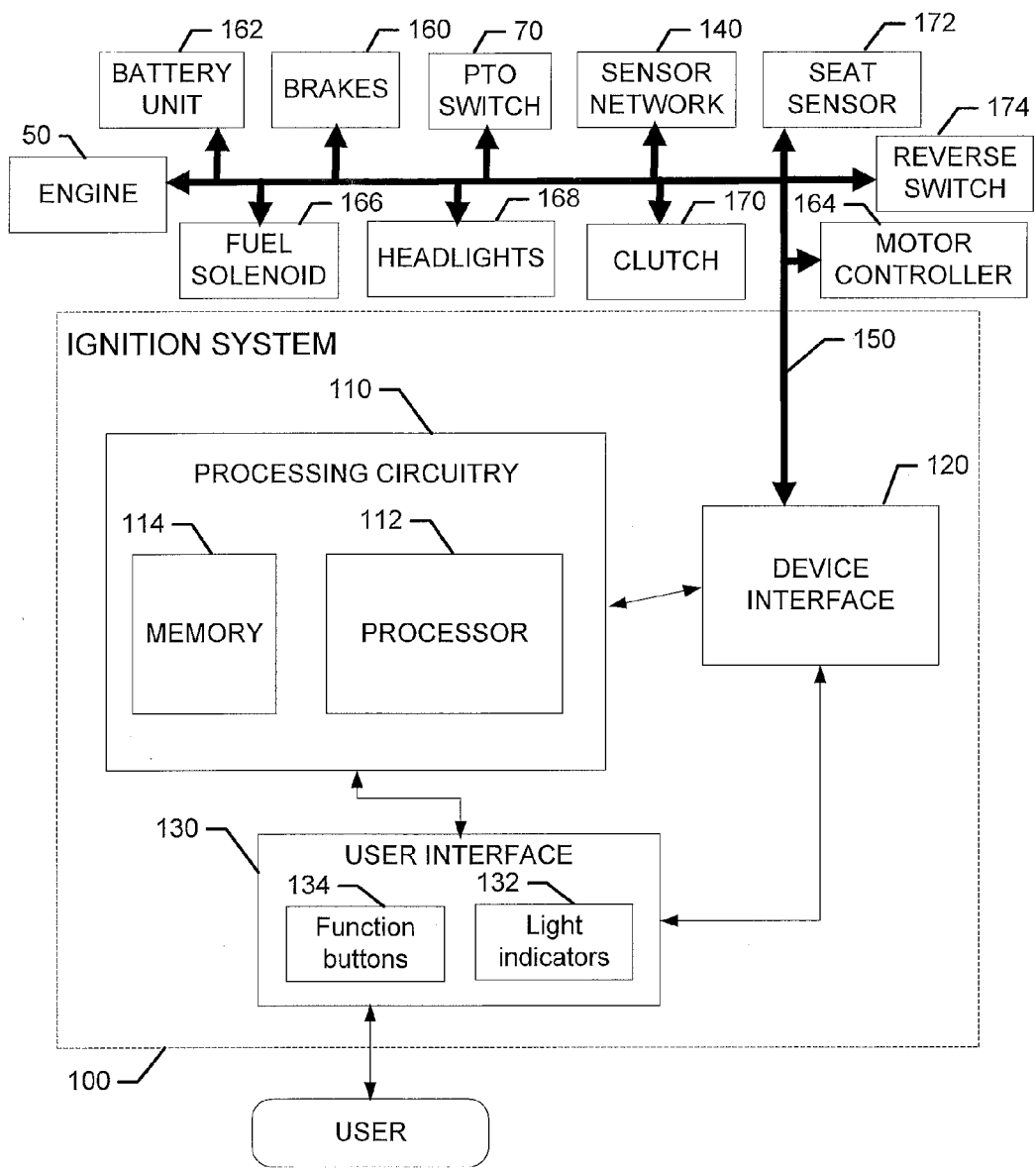
FIG. 2 illustrates a functional block diagram for explaining the operation of an ignition system of an example embodiment.

FIG. 2 illustrates a functional block diagram for explaining the operation of an ignition system 100 of an example embodiment. As shown in FIG. 2, the ignition system 100 may include processing circuitry 110 to control starting of the engine 50 of the riding lawn care vehicle 10 of an example embodiment as described herein. In this regard, for example, the ignition system 100 may utilize the processing circuitry 110 to provide electronic control inputs to one or more functional units of the riding lawn care vehicle 10 and to process data generated by the one or more functional units regarding various operational parameters relating to the riding lawn care vehicle 10. The processing circuitry 110 may be configured to perform data processing, control function execution, and/or other processing and management services according to an example embodiment of the present invention. In some embodiments, the processing circuitry 110 may be embodied as a chip or chip set. In other words, the processing circuitry 110 may comprise one or more physical packages (e.g., chips) including materials, components, and/or wires on a structural assembly (e.g., a baseboard). The structural assembly may provide physical strength, conservation of size, and/or limitation of electrical interaction for component circuitry included thereon. The processing circuitry 110 may therefore, in some cases, be configured to implement an embodiment of the present invention on a single chip or as a single "system on a chip." As such, in some cases, a chip or chipset may constitute means for performing one or more operations for providing the functionalities described herein.

In an example embodiment, the processing circuitry 110 may include one or more instances of a processor 112 and memory 114 that may be in communication with or otherwise control a device interface 120 and, in some cases, a user interface 130. As such, the processing circuitry 110 may be embodied as a circuit chip (e.g., an integrated circuit chip) configured (e.g., with hardware, software, or a combination of hardware and software) to perform operations described herein. However, in some embodiments, the processing circuitry 110 may be embodied as a portion of an on-board computer. In some embodiments, the processing circuitry 110 may communicate with electronic components and/or sensors of a sensor network 140 (e.g., sensors that measure variable values related to riding lawn care vehicle parameters) of the riding lawn care vehicle 10 via a single data bus (e.g., data bus 150), which may form a portion of the device interface 120 or which may connect to the device interface 120. As such, the data bus 150 may connect to a plurality or all of the sensors, switching components, and/or other electrically-controlled components of the riding lawn care vehicle 10 to the processing circuitry 110.

In an example embodiment, the data bus 150 may further provide a mechanism by which the processing circuitry 110 can interface with or control other functional units of the riding lawn care vehicle 10. For example, in some embodiments, the data bus 150 may provide control inputs to and/or receive status inputs from functional units such as any or all of the engine 50, PTO switch 70, brakes 160 (which may include a parking brake), a battery unit 162, one or more motor controllers 164, a fuel solenoid 166, headlights 168, clutch 170, seat sensor 172, reverse switch 174, and/or the like.

The user interface 130 may be in communication with the processing circuitry 110 to receive an indication of a user input at the user interface 130 and/or to provide an audible, visual, mechanical, or other output to the user. As such, the user interface 130 may include, for example, a display, one or more levers, switches, buttons or keys (e.g., function buttons), and/or other input/output mechanisms. In an example embodiment, the user interface 130 includes the ignition interface 80, which may further include a plurality of light indicators 132 and a plurality of function buttons 134 that will be described in greater detail below.

The light indicators 132 may be LEDs or LED backlit images that are lit or unlit to indicate corresponding status information. The information indicated by the light indicators 132 may be directly related to the corresponding function buttons 134 in some cases. However, in other cases, some of the light indicators 132 may indicate status information associated with other functional units (e.g., those connected to the data bus 150). Meanwhile, the function buttons 134 may be employed for initiation of various control operations to actuate or turn off corresponding ones of the functional units. However, in an example embodiment, the function buttons 134 may also have an alternative functionality associated with starting of the engine 50. In this regard, for example, the function buttons 134 may be used for the provision of a code that is required to start the engine 50. In an example embodiment, the function buttons 134 may include one button that functions as a start button that must be depressed or otherwise actuated in order to start the engine 50. However, the start button may not be enabled for operation to start the engine 50 until an unlocking code is entered via other ones of the function buttons 134. Thus, the function buttons 134 may include at least some code entry or unlocking buttons and a start button, and the start button may only be unlocked for starting responsive to entry of an unlocking code using the code entry or unlocking buttons.

The device interface 120 may include one or more interface mechanisms for enabling communication with other devices (e.g., sensors of the sensor network 140 and/or other accessories or functional units such as motors, engines, servos, switches, or other operational control devices for providing control functions). In some cases, the device interface 120 may be any means such as a device or circuitry embodied in either hardware, or a combination of hardware and software that is configured to receive and/or transmit data from/to sensors in communication with the processing circuitry 110 via the data bus 150. Thus, for example, the device interface 120 may provide interfaces for communication of components of the riding lawn care vehicle 10 via the data bus 150.

The processor 112 may be embodied in a number of different ways. For example, the processor 112 may be embodied as various processing means such as one or more of a microprocessor or other processing element, a coprocessor, a controller, or various other computing or processing devices including integrated circuits such as, for example, an ASIC (application specific integrated circuit), an FPGA (field programmable gate array), or the like. In an example embodiment, the processor 112 may be configured to execute instructions stored in the memory 114 or otherwise accessible to the processor 112. As such, whether configured by hardware or by a combination of hardware and software, the processor 112 may represent an entity (e.g., physically embodied in circuitry—in the form of processing circuitry 110) capable of performing operations according to embodiments of the present invention while configured accordingly. Thus, for example, when the processor 112 is embodied as an ASIC, FPGA, or the like, the processor 112 may be specifically configured hardware for conducting the operations described herein. Alternatively, as another example, when the processor 112 is embodied as an executor of software instructions, the instructions may specifically configure the processor 112 to perform the operations described herein.

In an example embodiment, the processor 112 (or the processing circuitry 110) may be embodied as, include, or otherwise control the operation of the ignition system 100 based on inputs received by the processing circuitry 110 responsive to positioning of the function buttons 134 and/or the operation of various ones of the functional units. As such, in some embodiments, the processor 112 (or the processing circuitry 110) may be said to cause each of the operations described in connection with the ignition system 100 in relation to operation of the functional units and/or function buttons 134 to undertake the corresponding functionalities responsive to execution of instructions or algorithms configuring the processor 112 (or processing circuitry 110) accordingly. In an example embodiment, the processor 112 may be physically located within a body that houses the electronics for the ignition interface 80, and the processor 112 may be the processor for the entire riding lawn care vehicle 10.

In an exemplary embodiment, the memory 114 may include one or more non-transitory memory devices such as, for example, volatile and/or non-volatile memory that may be either fixed or removable. The memory 114 may be configured to store information, data, applications, instructions, or the like for enabling the processing circuitry 110 to carry out various functions in accordance with exemplary embodiments of the present invention. For example, the memory 114 could be configured to buffer input data for processing by the processor 112. Additionally or alternatively, the memory 114 could be configured to store instructions for execution by the processor 112. As yet another alternative or additional capability, the memory 114 may include one or more databases that may store a variety of data sets responsive to input from the sensor network 110, functional units, and/or the function buttons 134. Among the contents of the memory 114, applications may be stored for execution by the processor 112 in order to carry out the functionality associated with each respective application. In some cases, the applications may include instructions for recognition of various input signals related to engine ignition as described herein.

In an example embodiment, various ones of the functional units may impact each other. For example, the PTO switch 70 (which may be an electric or manual switch) may be used to alter a position of the clutch 170. Likewise, the motor controller 164 (if employed) may impact the application of battery power from the battery unit 162 to either a drive motor or a cutting motor. The position of the fuel solenoid 166 may impact operation of the engine 50 by cutting off or allowing fuel to reach the engine 50 in embodiments where the engine 50 is a gasoline engine. Inputs regarding position of the brakes 160 and/or the PTO switch 70 may impact operation of the clutch 170, engine 50, and/or the like. Battery unit 162 status, status of the headlights 168, and/or other sensor network component status may be reported to and/or controlled by operation of the function buttons 134. Accordingly, it should be appreciated that the ignition system 100 of an example embodiment, and particularly the data bus 150 and the processing circuitry 110 may enable the user interface 130 to provide a relatively robust interface mechanism for controlling starter operation and numerous other functions of the riding lawn care vehicle 10.

Figure 3:
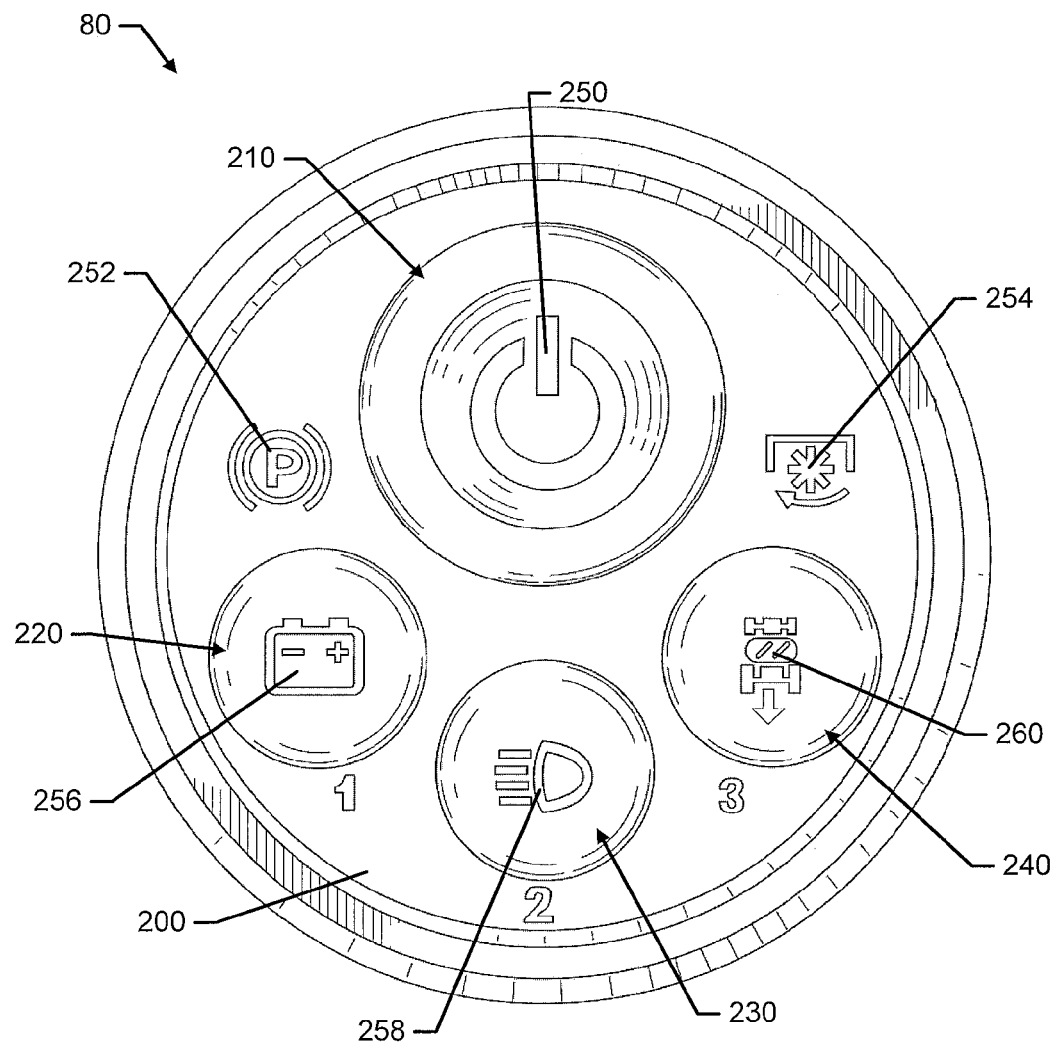
FIG. 3 illustrates a plan view of an arrangement of the ignition interface of an example embodiment.

FIG. 3 illustrates a plan view of an arrangement of the ignition interface 80 of an example embodiment. In this regard, FIG. 3 illustrates an assembly which may include a housing in which circuitry of the ignition interface 80 may be housed. The housing may be plugged into a receptacle of the operations panel 14 to plug into a system of wiring and/or circuitry of the riding lawn care vehicle 10. As shown in FIG. 3, the ignition interface may include a panel face 200 onto which the light indicators 132 and the function buttons 134 are provided. In this example, the panel face 200 is round and includes raised buttons (i.e., the function buttons 134) provided thereon. Meanwhile, the light indicators 132 may be provided in the panel face 200 itself, or in one or more of the function buttons 134. The light indicators 132 may each be a single color or may have multiple potential colors. In some cases, the light indicators 132 may have variable intensity so that brightness may ramp up (or down) over time. In some cases, the ramp up or down function may be based on external conditions. For example, if it is dark, a ramp up may be initiated. Blinking, lighting patterns, and/or color changes may indicate specific conditions or operation modes related to respective different ones of the light indicators 132, or to the operation of the ignition interface 80 in general.

The ignition interface 80 may have multiple modes of operation that impact the functioning of the ignition system 100 and various other components of the riding lawn care vehicle 10. In an example embodiment, the ignition interface 80 may have an off or sleep mode, a wake-up mode, a ready to start or starting mode, and a running mode. The wake-up mode and the starting mode may generally be transient modes that are not allowed to be maintained for a long period of time. As such, the wake-up mode and the starting mode may each have time limits associated therewith such that if no activity is noted in each respective mode within a given period of time, the ignition interface 80 will be returned to one of the non-transient modes of operation (i.e., the sleep mode or the running mode). The sleep mode and the running mode are generally capable of continued and indefinite operation as long as other prerequisites to operation in such modes are met.

As shown in FIG. 3, a power button 210, a first key 220 a second key 230 and a third key 240 may each be examples of function buttons 134. The function buttons 134 may be any kind of pushbutton, press button, or the like. Thus, the function buttons 134 may be flush-mounted or may extend outward from the panel face 200. Actuation of the function buttons 134 may initiate a changing of a switch position or an indication to the processing circuitry 110 to indicate that a corresponding function button 134 has been actuated. In some cases, the function buttons 134 may be biased switches that return to their original position after each actuation thereof. Thus, a most recent position or current status of the function buttons 134 may be maintained within the processing circuitry 110, and the processing circuitry 110 may also interface with other appropriate devices to actuate the functionality associated with any one of the function buttons 134 that is actuated and/or to turn on any light indicators 132 or other display indications that are appropriate to indicate the status of a device impacted by operation of one of the function buttons 134.

Meanwhile, a first light 250, a second light 252, a third light 254, a fourth light 256, a fifth light 258, and a sixth light 260 may be examples of light indicators 234. In an example embodiment, the first light 250 may be associated with the power button 210 and may indicate engine status and/or ignition interface 80 mode of operation. The first light 250 may be capable of showing different colors dependent upon the mode of operation of the ignition interface 80. The first light 250 may also blink according to specific patterns that indicate receipt of information or a mode of operation.

The second light 252 may be a parking brake indicator light that is lit when the parking brake is or is not set, depending on the current mode. For example, when a fault associated with the parking brake is detected, the second light 252 may be lit. As such, if setting of the parking brake is a precondition for engine starting, and the parking brake is not set, the second light 252 may be lit and may clear when the parking brake is set. The second light 252 may also be lit in instances where all lights, or combinations of lights, are lit to indicate certain faults. The third light 254 may be a PTO engagement indicator light that is lit when the PTO is engaged and off when the PTO is not engaged. The second and third lights 252 and 254 may not be specifically or physically associated with any one of the function buttons 134.

The fourth light 256 may be a battery light that indicates a status of the battery unit 162 when lit. For example, the fourth light 256 may be lit whenever battery level is low. In some embodiments, pressing the fourth light 256 may present an inquiry as to charge status of the battery. The fourth light 256 may present a color or a blink pattern to indicate current state of charge of the battery. The fourth light 256 may be disposed on the first key 220.

The fifth light 258 may be a headlight indicator light that is lit when the headlights 168 are energized and off when they are not energized. In some embodiments, the headlights may ramp up to full brightness over time when they are energized, and may ramp down to being off when they are de-energized. The headlights may stay on for a delay period after engine shutdown if the operator does not manually turn them off using the second key 230. If the headlights are turned on without the engine running, they may automatically shutoff after a specified period of time (e.g., two minutes). In some embodiments, if the engine is not running, the operator may be required to enter a valid code to turn on the headlights. However, if the headlights turn off after the automatic shutoff period, the operator may have a relatively short window of time during which the lights may be turned back on without reentry of the code. In some cases, the fifth light 258 may also light to indicate faults associated with the headlights (e.g., one or more burned out bulbs). The fifth light 258 may be disposed on the second key 230.

The sixth light 260 may be a mow-in-reverse (MIR) indicator light that is lit when MIR is activated and off when MIR is not activated. However, in some embodiments, the sixth light 260 may be used to indicate whether steering handles are in the park position. The sixth light 260 may light or blink to indicate various fault conditions associated with MIR or with the position of steering handles. In some cases, the sixth light 260 may have an amber color. The sixth light 260 may be disposed on the third key 240.

In an example embodiment in which the first, second, and third keys 220, 230, and 240 each have a corresponding light indicator associated therewith (e.g., fourth light 256, fifth light 258, and sixth light 260), the corresponding light indicators may be associated with one of the functional operations that the respective keys are capable of initiating in at least one operating mode of the ignition interface 80. However, since the first, second, and third keys 220, 230, and 240 may have multiple functions (i.e., different functions in different modes) and one such function may be code entry, in some embodiments, a code value or number associated with each respective one of the first, second, and third keys 220, 230, and 240 may be indicated on or proximate to each key. Thus, for example, if a valid starting code is "1-3-2," the operator may be enabled to correlate the value "1" with the first key 220, and correlate the value "3" with the third key 240, while correlating the value "2" with the second key 230. The operator may then enter each key actuation in sequence to unlock the functionality of the power button 210 for engine startup. In other words, the code entry keys may enter the code for shifting from wake-up mode to starting mode.

Figure 4:
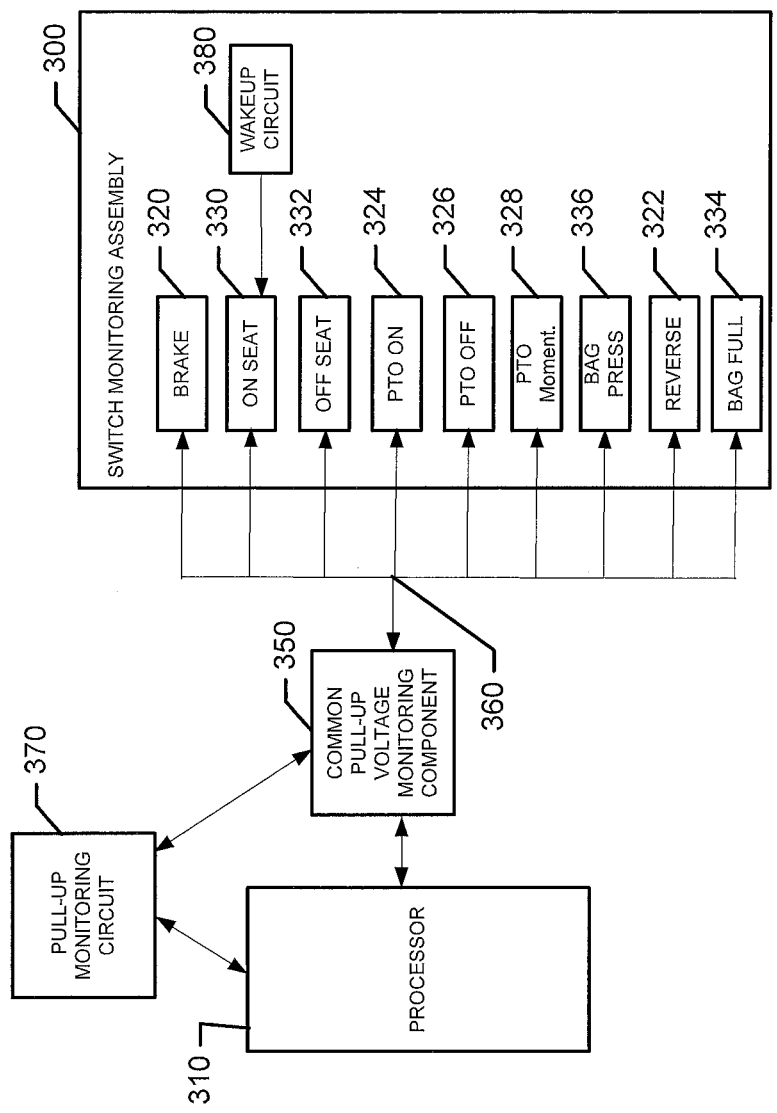
FIG. 4 illustrates a block diagram of an example of a switch monitoring assembly according to an example embodiment.
Figure 5:
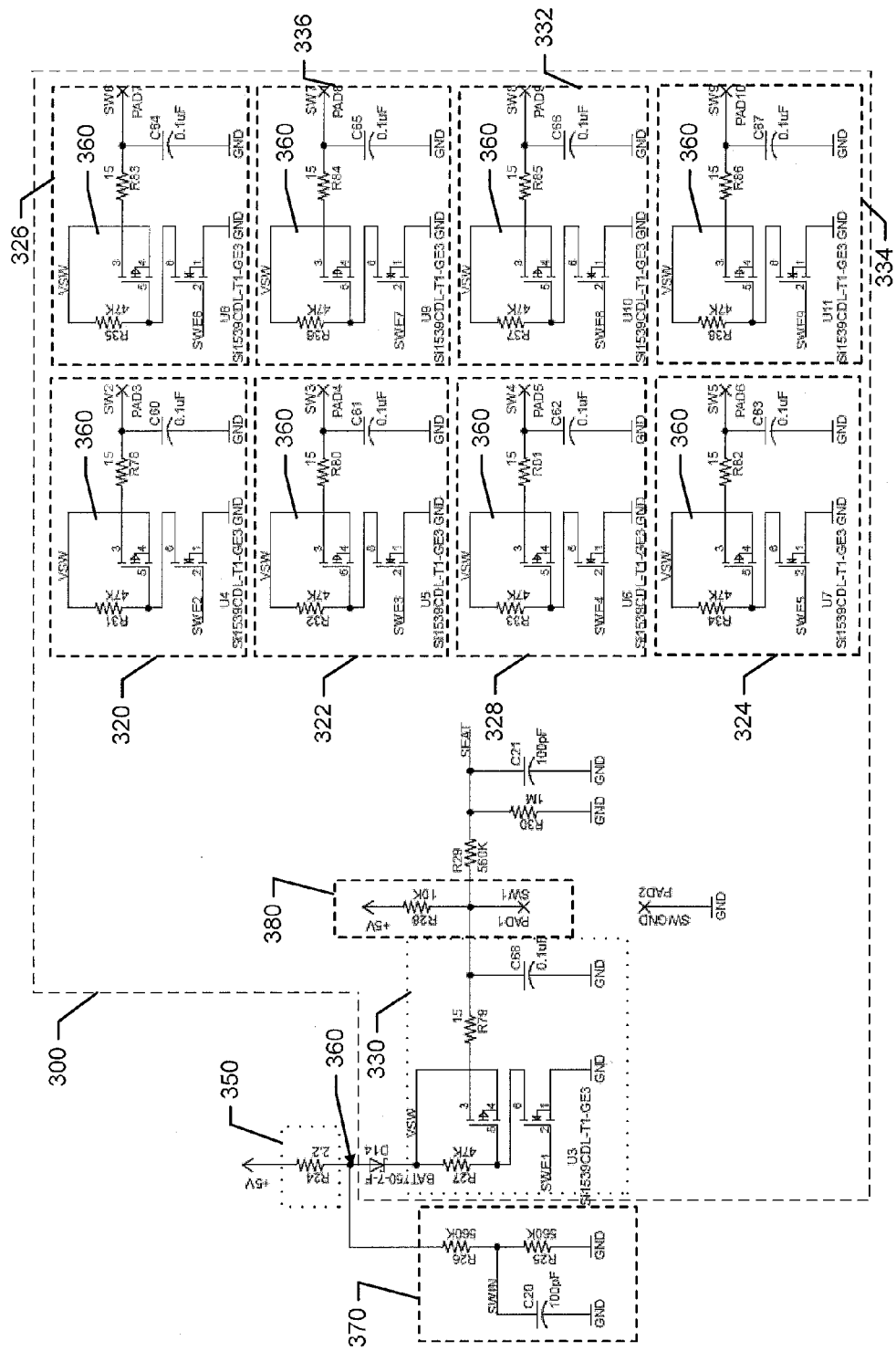
FIG. 5 illustrates a circuit diagram according to one possible implementation design of the switch monitoring assembly according to an example embodiment.

FIG. 4 illustrates a block diagram of an example of a switch monitoring assembly 300 according to an example embodiment. FIG. 5 illustrates a circuit diagram according to one possible implementation design of the switch monitoring assembly 300 according to an example embodiment. It should be appreciated that the switch monitoring assembly 300 may interface by a processor 310 or processing circuitry. Thus, for example, various control operations described herein relative to the switch monitoring assembly 300 may be executed by the processor 310. As such, for example, at least some of the functions attributable to the switch monitoring assembly 300 (and/or components thereof) may be carried out by or otherwise instructed by the processor 310. The processor 310 may therefore provide the hardware for hosting software to configure the system for control and implementation of monitoring and/or control techniques consistent with example embodiments.

The processor 310 may be configured to perform input processing, control function execution, and/or other services according to an example embodiment of the present invention. In some embodiments, the processor 310 may be a portion of processing circuitry that may be embodied as a chip or chip set. In other words, the processing circuitry may comprise one or more physical packages (e.g., chips) including materials, components, and/or wires on a structural assembly (e.g., a baseboard). In an example embodiment, the processing circuitry may include one or more instances of a processor (e.g., processor 310) and memory (e.g., non-transitory storage media) that may be in communication with or otherwise control, among other things, the switch monitoring assembly 300. As such, the processing circuitry may be configured (e.g., with hardware, software, or a combination of hardware and software) to perform at least some of the operations described herein.

The processor 310 may be embodied in a number of different ways. For example, the processor 310 may be embodied as various processing means such as one or more of a microprocessor or other processing element, a coprocessor, a controller, or various other computing or processing devices including integrated circuits such as, for example, an ASIC (application specific integrated circuit), an FPGA (field programmable gate array), or the like. In an example embodiment, the processor 310 may be configured to execute instructions stored in the memory or otherwise accessible to the processor 310. As such, whether configured by hardware or by a combination of hardware and software, the processor 310 may represent an entity (e.g., physically embodied in circuitry—in the form of processing circuitry) capable of performing operations according to embodiments of the present invention while configured accordingly. Thus, for example, when the processor 310 is embodied as an ASIC, FPGA, or the like, the processor 310 may be specifically configured hardware for conducting the operations described herein. Alternatively, as another example, when the processor 310 is embodied as an executor of software instructions, the instructions may specifically configure the processor 310 (which could in some cases otherwise be a general purpose processor) to perform the operations described herein.

In an example embodiment, the processor 310 may be capable of interfacing with various modules of the switch monitoring assembly 300 in a selective manner to enable the processor 310 to monitor switch positions or sensor conditions to determine the state of various components of the lawn care device that employs the switch monitoring assembly 300. The modules may include, for example, a brake module 320, a reverse module 322, a PTO on module 324, a PTO off module 326, a PTO momentary module 328, an on seat module 330, an off seat module 332, a bag full module 334, and a bag presence module 336. It should be appreciated, however, that more or fewer modules may be used in some embodiments. Moreover, some of the modules listed above may be replaced, eliminated, or further augmented in some cases dependent upon the type of device upon which the switch monitoring assembly 300 is employed. For example, if a mower with zero turn steering levers is employed, the reverse module 322 and the bag pressure module 336 may be replaced with sensors for monitoring left and right side turn levers, respectively.

The brake module 320 may include a circuit configured to monitor brake status. The reverse module 322 may be configured to monitor the status of the engine relative to operating in reverse. The PTO on module 324 may be configured to monitor whether the PTO is on. The PTO off module 326 may be configured to monitor whether the PTO is off. The PTO momentary module 328 may be configured to monitor whether the on/off status of the PTO does not match momentarily for certain functions that allow, for example, a double activation to achieve a desired result. For example, if the PTO on module 324 indicates that the PTO switch is not on, but the PTO off module 326 does not indicate that the PTO switch is off, there is a lack of agreement regarding PTO position and the PTO switch may be considered faulty if the situation persists for a given period of time. Thus, the PTO momentary module 328 may be activated to indicate a situation where the PTO switch is in some intermediate position by design. The on seat module 330 may be configured to monitor whether the presence switch associated with an operator being in the seat 20 is activated. The off seat module 332 may be configured to monitor whether the presence switch associated with an operator being in the seat 20 is not activated. The bag full module 334 and a bag presence module 336 may be configured to check bag status.

In an example embodiment, the various modules may be connected to respective different pins of the processor 310. The processor 310 may selectively monitor each of the modules in accordance with a cyclical monitoring process. For example, every 50 msec, the processor 310 may cycle through each module and detect a status of the corresponding switch or sensor associated with each module. In some cases, the monitoring of each module may consume some small amount of time within the 50 msec duty cycle associated with conducting monitoring.

To establish conditions for causing monitoring of the modules, some example embodiments may require a monitoring voltage to be provided for each of the modules. In a conventional system, a pull-up resistor may be provided in connection with each respective module to try to establish the monitoring voltage. However, in accordance with an example embodiment, a common pull-up voltage monitoring component 350 may be provided to set the monitoring voltage for all of the modules at a common monitoring voltage node 360. Example embodiments may also utilize a pull-up monitoring circuit 370 that is configured to monitor the status or health of the common pull-up voltage monitoring component 350. Although not required, some embodiments may further employ a wakeup circuit 380 that may be employed in connection with one or more of the modules. The wakeup circuit 380 may enable the corresponding module (e.g., the on seat module 330) to be ready for operation in response to a triggering event without startup of the riding lawn care vehicle 10. For example, if the operator sits on the seat 20 of the riding lawn care vehicle 10, the wakeup circuit 380 may be activated so that the on seat module 330 can detect the presence of the operator and perhaps also count the on seat event. As such, the wakeup circuit 380 (which includes R28) may be configured to enable the processor 310 to monitor status of the on seat module 330 prior to the ignition interface 80 being manipulated by the operator to power up the riding lawn care vehicle 10.

As shown in FIG. 5, the common monitoring voltage node 360 may be common to each of the modules. Thus, the common pull-up voltage monitoring component 350 (e.g., R24) may be configured to provide the monitoring voltage at the common monitoring voltage node 360 to enable all of the modules to be selectively monitored in sequence by the processor 310. By using a single common pull-up voltage monitoring component 350, the cost and complexity of the switch monitoring assembly 300 may be reduced. Furthermore, since there are fewer components in which heat is dissipated, the overall heat generation of the system may be reduced.

The on seat module 330 may be coupled to the common monitoring voltage node 360 via D14, and may include R27, R79, C68 and two transistors). In this regard, the on seat module 330 may include R27 coupled between terminal 5 of the second transistor and the common monitoring voltage node 360, which is coupled to terminals 3 and 4 of the second transistor and to R79. R79 is also coupled to ground through C68 and to the wakeup circuit 380. R27 and terminal 5 of the second transistor are coupled to terminal 6 of the first transistor. Terminal 1 of the first transistor is coupled to ground and terminal 2 of the first transistor is coupled to a terminal SWF1.

In accordance with an example embodiment, the use of the pull-up monitoring circuit 370 may also enable the overall operational health of the assembly to be monitored by enabling the processor 310 to check the status of the common pull-up voltage monitoring component 350 (R24). In this regard, for example, all of the modules may share a dedicated ground circuit that is pulled up to the monitoring voltage (e.g., 5V) at the common monitoring voltage node 360 using a minimum current (e.g., about 250 mA). This structure may provide minimum current to the switches of the system so that un-sealed switches may be employed instead of the more expensive sealed switches with an adequate cleaning current. This structure may also provide for verification that the un-sealed switches are providing sufficient current to avoid false positive signals if the un-sealed switches happen to become wet.

In accordance with an example embodiment, the pull-up monitoring circuit 370 may not only monitor the health of the common pull-up voltage monitoring component 350, but may also be configured to monitor each switch input or module. Since the processor 310 switches monitoring on and off sequentially (e.g., via SWE1-9), the processor 310 may employ a single input (e.g., SWIN) to monitor all the modules as they are never on at the processor 310 at the same time and are coincident with the SWE1-9 on/off requests. This structure may reduce the input pin count requirement for the processor 310 for this case even though it adds to the pin count by one for pins turning each input monitoring circuit on/off sequentially. As such, for example, the pull-up monitoring circuit 370 may be used doubly as a monitor circuit and a switch status circuit timed in conjunction with the appropriate processor output that goes to modules 320,322,324,326,328,330,332,334,336 at the "SWE'X'" pin. Each of these modules may be structured similarly to the structure of the seat module 330. In this regard, for example, when the processor 310 activates the SWE5, it monitors the SWIN for the actual switch status, but when none of the SWE'X' pins are being activated, that SWIN is verifying that the common pull-up voltage monitoring component 350 and its corresponding voltage supply (e.g., 5V) are still healthy.

As shown in FIG. 5, the pull-up monitoring circuit 370 may include C20 and R25 in parallel with each other and connected to ground at one terminal and to R26 at the opposing terminal. The pull-up monitoring circuit 370 is connected to the common monitoring voltage node 360 via R26.

In accordance with an example embodiment, the switch monitoring assembly 300 may also include the ability to verify at least two opposing states of some of the switches. For example, the on seat module 330 and the off seat module 332 may each monitor the opposite on/off states of the seat presence sensing switches or sensors. Meanwhile, the PTO on module 324 and the PTO off module 326 may each monitor the opposite on/off states of the PTO switch.

In this regard, for example, the un-seated and seated positions of the seat switch may each have a dedicated wire to allow the switch monitoring assembly 300 to monitor both statuses of the seat switch. If the on seat module 330 indicates that the operator is on the seat, the off seat module 332 should indicate the opposite. Thus, if the on seat module 330 is activated or set, the off seat module 332 should be inactivated or not set. The states of each module can then be compared to ensure that they reconcile with each other. Moreover, the number of activations of each module may also be counted and compared to ensure that there is an equal number of activations of each (or that they remain within one count of each other).

Similarly, if the PTO on module 324 indicates that the PTO is on, the PTO off module 326 should indicate the opposite. Thus, if the PTO on module 324 is activated or set, the PTO off module 326 should be inactivated or not set. The states of each module can then be compared to ensure that they reconcile with each other. Moreover, the number of activations of each module may also be counted and compared to ensure that there is an equal number of activations of each (or that they remain within one count of each other). When the module counts and/or statuses are not reconciled, the processor 310 may be configured to render the corresponding components inoperative and/or may indicate that there is a fault (e.g., a switch being stuck or bypassed). In particular, in some cases, if the module fails to report the off and on positions of the PTO switch in opposite statuses for more than a predetermined period of time (e.g., 150 msec), then the PTO 12V output driver may be disabled and the PTO input may be considered to be faulty. In such a state, the PTO may no longer be considered to be part of the start functionality and the ignition interface 80 may blink at a predetermined frequency to issue a start warning. The off-neutral-on momentary PTO (i.e., the PTO momentary module 328) may work similarly except that the processor 310 may be enabled to act as appropriate for a momentary activation and deactivation scenario for faulting.

Example embodiments may therefore enable the monitoring of both states of certain safety-related switches in order to ensure that an accurate status of such switches can be determined before any interlocks, safety features, or other functions associated with such features can be activated or utilized. Example embodiments may also enable the use of a single common pull-up voltage monitoring component 350 (e.g., a pull-up resistor) for setting the monitoring voltage for all sensing modules of the switch monitoring assembly 300. This reduces cost, heat generation, and complexity. Moreover, it also enables the processor 310 to monitor the status of the common pull-up voltage monitoring component 350.

Figure 6:
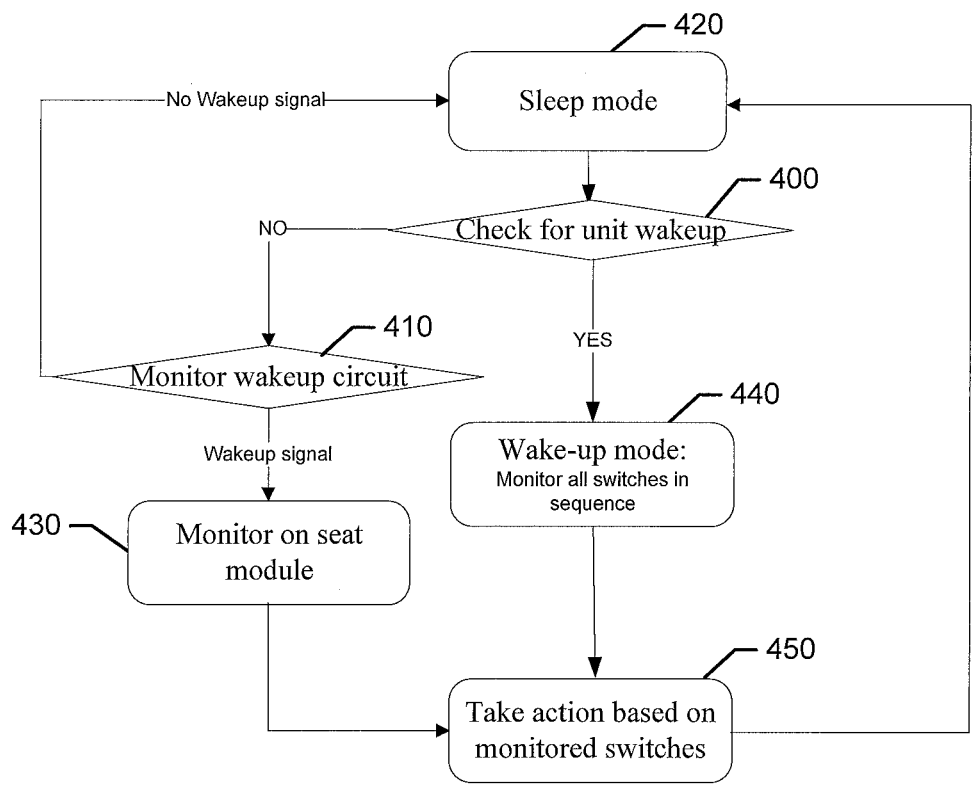
FIG. 6 provides a flow chart showing operation of a control algorithm according to an example embodiment.

In some cases, a method of controlling operation of the switch monitoring assembly 300 may be provided. FIG. 6 illustrates a block diagram of such a method. In some embodiments, the processor 310 may be configured to implement a control algorithm for starting of the riding lawn care vehicle 10 according to the method. The control algorithm may include at least a portion of its contents dedicated to performing some or all of the operations of FIG. 6 either alone or in combination with other executable instructions that the control algorithm may be capable of executing.

In an example embodiment, the method may include monitoring for a wakeup of the ignition interface at operation 400. If no wakeup is detected, the unit may remain in sleep mode and monitoring for a wakeup signal via the wakeup circuit may be conducted at operation 410. If no wakeup signal is received at the wakeup circuitry, the assembly may remain in a sleep mode at operation 420. If the wakeup signal is received, the on seat module may be monitored at operation 430. If the ignition interface has been awoken at operation 400, then the assembly may monitor all switches in sequence at operation 440. At operation 450, the method may include taking action based on the monitoring of the switches. The actions taken may include comparing opposing statuses of at least some switches, initiating interlocks or safety actions, indicating fault or normal operating conditions, returning to sleep mode, conducting engine start, or taking other prescribed and/or applicable actions.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. In cases where advantages, benefits or solutions to problems are described herein, it should be appreciated that such advantages, benefits and/or solutions may be applicable to some example embodiments, but not necessarily all example embodiments. Thus, any advantages, benefits or solutions described herein should not be thought of as being critical, required or essential to all embodiments or to that which is claimed herein. Although specific terms are employed herein, they are used in a generic and descriptive sense only and not for purposes of limitation.

That which is claimed:

1. A lawn care device comprising:
   an engine to selectively power the lawn care device;
   a frame supporting the engine of the lawn care device; and
   an ignition interface having a processor therein to enable selective powering of the lawn care device based at least in part on operation of the ignition interface,
   wherein the ignition interface comprises a switch monitoring assembly configured to enable the processor to monitor status of a plurality of switches associated with respective components of the lawn care device,
   wherein the switch monitoring assembly is further configured to enable the processor to monitor opposing statuses of at least one of the switches by detecting each of the opposing statuses, respectively, and
   wherein the processor is configured to count each instance of activation of the opposing statuses of the at least one of the switches and compare the count to determine a fault status of the at least one of the switches.

2. The lawn care device of claim 1, wherein the at least one of the switches is a seat presence switch or a PTO switch.

3. The lawn care device of claim 1, wherein the ignition interface further comprises a common pull-up voltage monitoring component configured to provide a monitoring voltage at a common monitoring voltage node to enable each of the switches to be selectively monitored in sequence by the processor.

4. The lawn care device of claim 3, wherein the ignition interface further comprises a pull-up monitoring circuit configured to monitor a status of the common pull-up voltage monitoring component.

5. The lawn care device of claim 1, wherein the at least one of the switches is a seat presence switch and the switch monitoring assembly comprises an on seat module for checking status of a first seat switch associated with detecting presence of an operator of the lawn care device on a seat of the lawn care device and an off seat module for checking status of a second switch associated with detecting absence of the operator on the seat of the lawn care device.

6. The lawn care device of claim 5, wherein the on seat module further comprises a wakeup circuit configured to enable the processor to monitor status of the on seat module prior to the ignition interface being manipulated by the operator to power up the lawn care device.

7. The lawn care device of claim 1, wherein the switch monitoring assembly comprises a first module configured to detect a first status among the opposing statuses and a second module, separate from the first module, configured to detect a second status among the opposing statuses.

8. An ignition system for a lawn care device, the ignition system comprising:
   a processor;
   a device interface configured to interface between the processor and a data bus operably coupled to a plurality of switches associated with respective components of the lawn care device, wherein the processor is configured to monitor status of the plurality of switches associated with respective components of the lawn care device, wherein the processor is further configured to monitor opposing statuses of at least one of the switches by detecting each of the opposing statuses, respectively, and wherein the processor is configured to count each instance of activation of the opposing statuses of the at least one of the switches and compare the count to determine a fault status of the at least one of the switches.

9. The ignition system of claim 8, wherein the at least one of the switches is a seat presence switch or a PTO switch.

10. The ignition system of claim 8, wherein the ignition system further comprises a common pull-up voltage monitoring component configured to provide a monitoring voltage at a common monitoring voltage node to enable each of the switches to be selectively monitored in sequence by the processor.

11. The ignition system of claim 10, wherein the ignition system further comprises a pull-up monitoring circuit configured to monitor a status of the common pull-up voltage monitoring component.

12. The ignition system of claim 8, wherein the ignition system further comprises a switch monitoring assembly, and wherein the at least one of the switches is a seat presence switch and the switch monitoring assembly comprises an on seat module for checking status of a first seat switch associated with detecting presence of an operator of the lawn care device on a seat of the lawn care device and an off seat module for checking status of a second switch associated with detecting absence of the operator on the seat of the lawn care device.

13. The ignition system of claim 12, wherein the on seat module further comprises a wakeup circuit configured to enable the processor to monitor status of the on seat module prior to the ignition system being manipulated by the operator to power up the lawn care device.

14. The ignition system of claim 8, wherein the processor is configured to:

detect a first status among the opposing statuses; and detect a second status among the opposing statuses, wherein the detection of the second status is performed separately from the detection of the first status.

15. A method of monitoring switch status in an ignition system for a lawn care device, the method comprising:

monitoring status of a plurality of switches associated with respective components of the lawn care device, and monitoring opposing statuses of at least one of the switches by detecting each of the opposing statuses, respectively, wherein monitoring opposing statuses of the at least one of the switches comprises counting each instance of activation of the opposing statuses of the at least one of the switches and comparing the count to determine a fault status of the at least one of the switches.

16. The method of claim 15, further comprising monitoring a wakeup circuit to determine which switches of the lawn care device to monitor.

17. The method of claim 15, wherein monitoring opposing statuses comprises employing a first module to detect a first status among the opposing statuses and employing a second module, separate from the first module, to detect a second status among the opposing statuses.

* * * * *